(12) United States Patent
Dalipi (10) Patent No.: US 7,412,469 B2
(45) Date of Patent: Aug. 12, 2008

(54) POWER AMPLIFIER PRE-DISTORTER TRAINING

(75) Inventor: Spendim Dalipi, Sollentuna (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 145 days.

(21) Appl. No.: 10/595,677

(22) PCT Filed: Nov. 25, 2003

(86) PCT No.: PCT/SE03/01825

§ 371 (c)(1),
(2), (4) Date: May 4, 2006

(87) PCT Pub. No.: WO2005/053153

PCT Pub. Date: Jun. 9, 2005

(65) Prior Publication Data

US 2007/0133713 A1    Jun. 14, 2007

(51) Int. Cl.
*G06F 17/10* (2006.01)

(52) U.S. Cl. .................................................... 708/300

(58) Field of Classification Search .......... 708/300–323
See application file for complete search history.

(56) References Cited

U.S. PATENT DOCUMENTS

| | | | | |
|---|---|---|---|---|
| 4,887,306 A * | 12/1989 | Hwang et al. | ............... | 708/322 |
| 5,049,832 A * | 9/1991 | Cavers | .................. | 330/149 |
| 5,568,411 A * | 10/1996 | Batruni | .................. | 708/322 |
| 5,586,068 A * | 12/1996 | Rakib | ..................... | 708/319 |
| 5,742,642 A * | 4/1998 | Fertner | .................. | 708/323 |
| 5,914,620 A | 6/1999 | Simons et al. | | |
| 5,923,712 A * | 7/1999 | Leyendecker et al. | ....... | 375/297 |
| 6,108,385 A | 8/2000 | Worley, III | | |
| 6,362,701 B1 * | 3/2002 | Brombaugh et al. | ......... | 708/313 |
| 6,591,282 B1 * | 7/2003 | Sonu | ..................... | 708/300 |
| 6,756,845 B1 * | 6/2004 | Mashhour | .................. | 330/149 |
| 7,120,656 B1 * | 10/2006 | Lam et al. | .................. | 708/319 |
| 2003/0058959 A1 | 3/2003 | Rafie et al. | | |

FOREIGN PATENT DOCUMENTS

GB    2385730 A    8/2003

OTHER PUBLICATIONS

Swedish Patent Office, International Search Report for PCT/SE2003/001825, dated Jun. 11, 2004.

* cited by examiner

*Primary Examiner*—Chat C Do
(74) *Attorney, Agent, or Firm*—Roger S. Burleigh (57) ABSTRACT

A power amplifier pre-distorter is formed by a FIR filter structure which includes an individual look-up table for each filter tap, where each look-up table represents a sample polynomial in a variable representing signal amplitude, and means for selecting, from each filter tap look-up table, a filter coefficient that depends on the amplitude of corresponding complex signal value to be multiplied by the filter tap. A training method for such a pre-distorter sets (S1) the entries of table $T_0$ and $T_1$ to predetermined values. Then it measures and stores (S2) a batch of input signals x and feedback signals y. New estimates of $T_0$ and $T_1$ are determined (S3) using an iteration of a least mean square based iterative procedure. Then it is tested (S4) whether the tables have converged. If the tables have converged, the current estimates are provided as the final tables. Otherwise another iteration (S2-S4) of the least mean square procedure is performed.

8 Claims, 8 Drawing Sheets

POWER AMPLIFIER PRE-DISTORTER TRAINING

TECHNICAL FIELD

The present invention relates to digital pre-distortion in power amplifiers with memory effects, and especially to pre-distorter training.

BACKGROUND

Power amplifiers are known to add more or less distortion to the signal they are designed to amplify. The reason for this is that a power amplifier has a non-linear input-output signal characteristic. This shows up as a broadened spectrum around the desired amplified signal, and as an unwanted inband component of the signal. As a counter-measure to decrease the effects of non-linearity, it is known to pre-distort the signal at the input of the amplifier as to give an un-distorted amplified signal at the output of the amplifier. This technique is called pre-distortion. Pre-distortion as implemented today normally uses a look-up table that is used to multiply the signal. The entry into the table is the magnitude of the signal at every time sample.

Memory effects is another problem related to power amplifiers. Memory effects typically show up as a non-symmetrical spectrum around the carrier at the output of a power amplifier. That is, although the carrier (desired signal) spectrum is perfectly symmetrical, the spurious spectrum coming from the distortion may be non-symmetrical with respect to the center of the carrier.

The methods commonly used to handle non-linearity do not in general take into account memory effects of the power amplifier. As the term "memory effects" indicates, there is a dependence not only on the present sample but also on delayed samples of the signal. Thus, a single table approach cannot take care of memory effects, but can only handle non-linearity.

Lei Ding et. al. [1] inspired by work by Kim and Konstantinou [2] have derived a pre-distortion method based on what they call "Memory Polynomials" that very well model memory effects. However, a drawback of this method is that it requires recalculation of the memory polynomials for each new input signal amplitude, which can be computationally costly, especially if many polynomials of high order are used. A further drawback of this method is the computationally costly training procedure used to determine the polynomial coefficients.

Reference [3] describes an amplifier provided with a pre-filter in the form of a FIR filter instead of a memory polynomial based pre-distorter. The coefficients of this filter are updated with an iterative least mean square algorithm.

SUMMARY

An object of the present invention is to provide a computationally efficient training method for pre-distortion based on memory polynomials.

This object is achieved in accordance with the attached claims.

The present invention is based on a FIR filter structure including individual look-up tables for the filter taps, where each look-up table represents a discretized memory polynomial. Briefly, the training method in accordance with the invention is based on iteratively and individually (independently) determining the filter coefficients of each look-up table, preferably by a corresponding iterative LMS (Least Mean Square) based procedure.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings.

Before the invention is described in detail, a brief description of the underlying problem will be given below.

Figure 1:
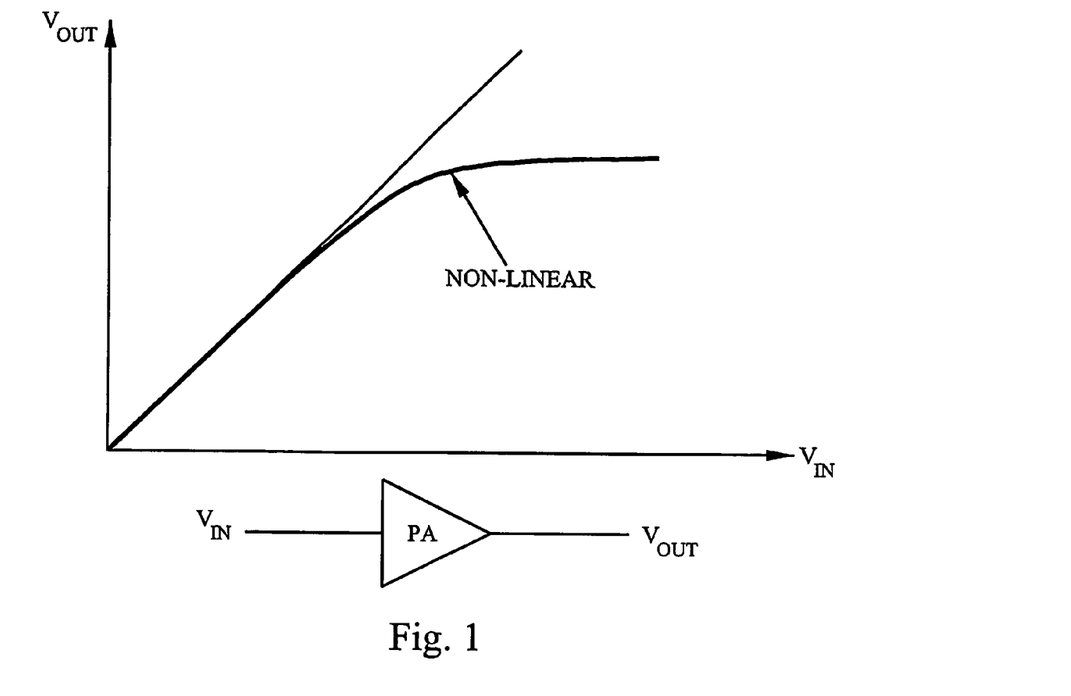
FIG. 1 is a diagram illustrating the non-linear input-output signal characteristic of a power amplifier.
Figure 2:
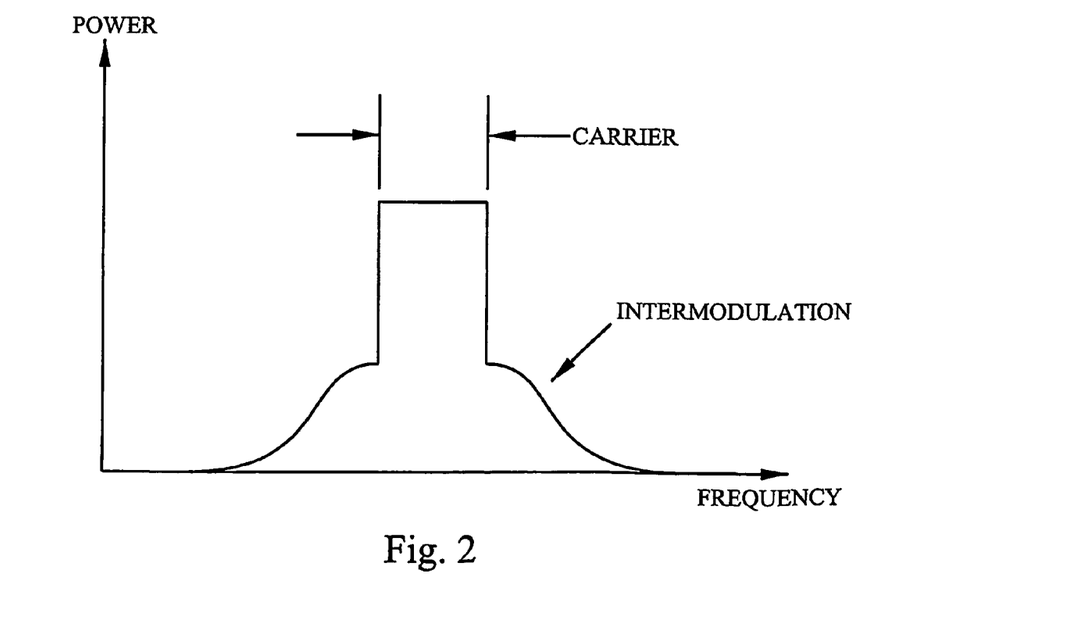
FIG. 2 is a diagram illustrating the spectrum of the signal amplified by a non-linear power amplifier.
Figure 3:
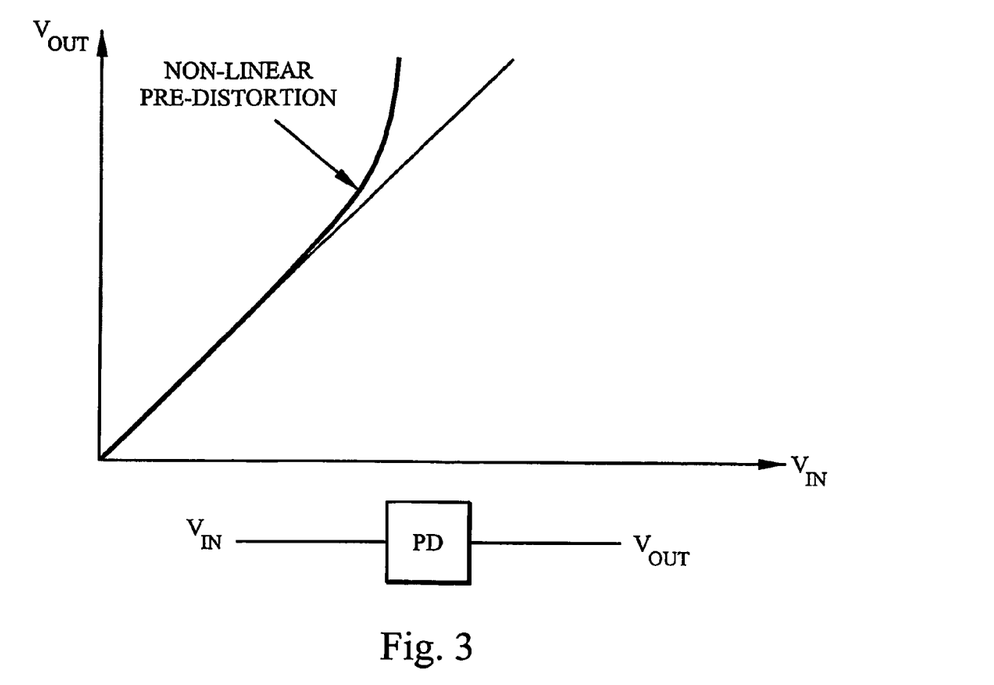
FIG. 3 is a diagram illustrating the input-output signal characteristic of a power amplifier pre-distorter for removing the non-linearity in FIG. 1.
Figure 4:
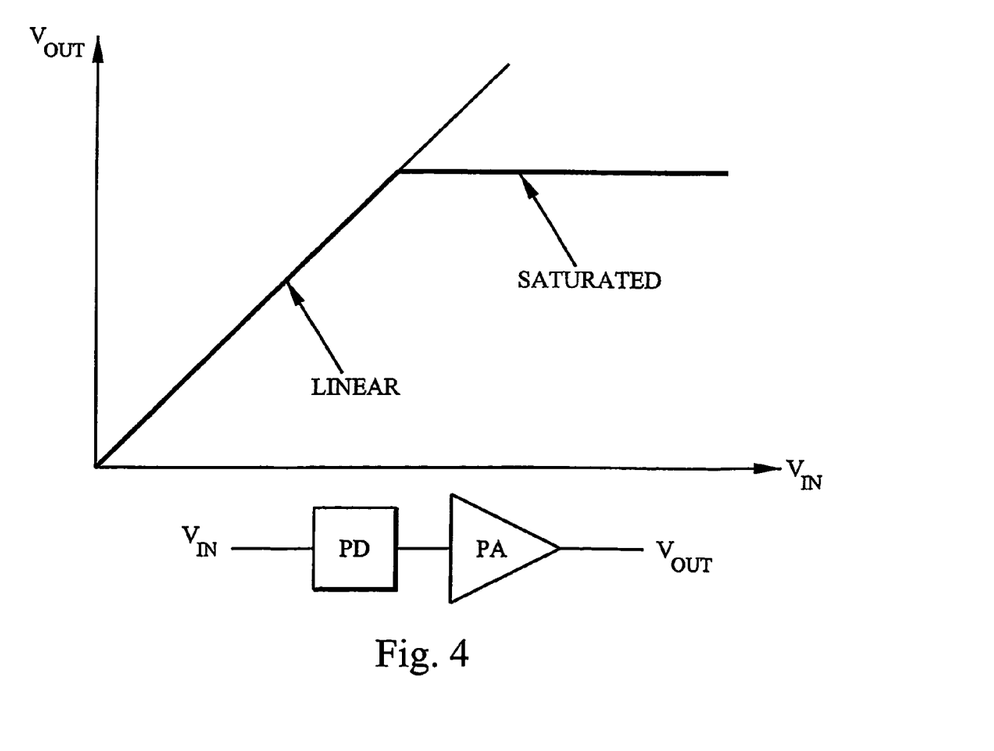
FIG. 4 is a diagram illustrating the input-output signal characteristic of a power amplifier provided with pre-distortion.

FIG. 1 illustrates the non-linear input-output signal characteristic of a power amplifier. At low input signal amplitudes the amplifier is almost linear, but at higher amplitudes it becomes more and more non-linear until it is saturated. This non-linearity shows up as a broadened spectrum around the desired amplified signal (and as an unwanted inband component of the signal), as illustrated in FIG. 2. As a counter-measure to decrease the effects of non-linearity, it is known to pre-distort the signal at the input of the amplifier to give an un-distorted amplified signal at the output of the amplifier. This technique is called pre-distortion and is illustrated in FIG. 3. The input-output signal characteristic for a pre-distorted power amplifier is essentially linear up to saturation, as illustrated in FIG. 4.

Figure 5:
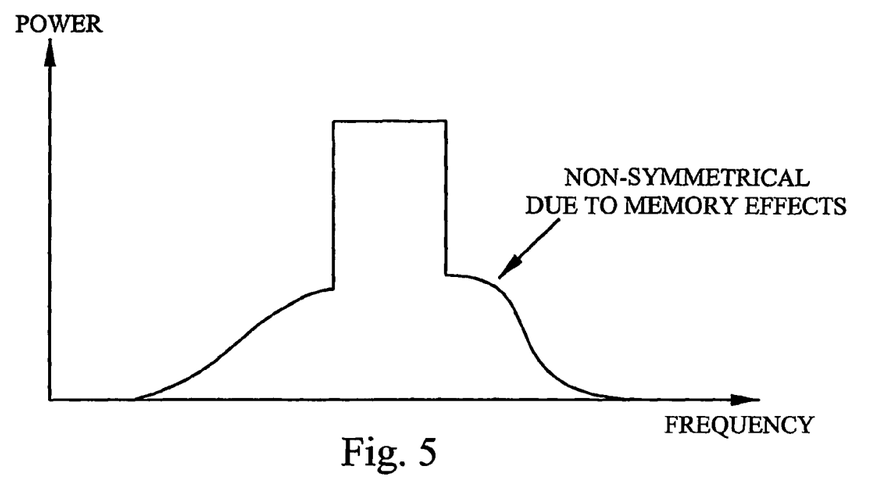
FIG. 5 is a diagram illustrating the spectrum of the signal amplified by a non-linear power amplifier with memory.

Memory effects is another problem related to power amplifiers. Memory effects typically show up as a non-symmetrical spectrum around the carrier at the output of a power amplifier, as illustrated in FIG. 5. That is, although the carrier (desired signal) spectrum is perfectly symmetrical, the spurious spectrum coming from the distortion may be non-symmetrical with respect to the center of the carrier.

There is a theoretical way of designing a pre-distorter that takes care of all memory effects. This is called the Volterra series. The Volterra series is an extension to the well-known Taylor series, which can be used as a pre-distorter for memory-less amplifiers. The Volterra series, however, also takes into account time-delayed terms that may quite accurately model the pre-distortion, and may therefore be used to suppress the distortion spectrum.

However, a Volterra series quite rapidly gets large in terms of the number of possible terms in the expansion. For example, a polynomial of degree 5 with a memory depth (maximum delay) of 5 sample units will give rise to at least 500 coefficients.

Since the full Volterra series can not be implemented with reasonable complexity, an approximation based on "Memory Polynomials" has been suggested in [1]. In this approximation the pre-distortion PD(n) may be expressed as:

$$PD(n) = \sum_{k=1}^{K} \sum_{q=0}^{Q} a_{kq} x(n-q)|x(n-q)|^{k-1} \quad (1)$$

Unfortunately this expression is still quite complicated, and a drawback of this prior art method is that the expression has to be evaluated for each new input sample x(n). However, as will be shown below, this expression may be rewritten into a more suitable form for practical implementation. The derivation essentially includes three steps:

1. Separate the double sum into partial sums including only terms with the same delay. This gives:

$$PD(n) = \sum_{k=1}^{K} \sum_{q=0}^{Q} a_{kq} x(n-q)|x(n-q)|^{k-1} =$$

Separate delays into different sums
$$\begin{cases} = \sum_{k=1}^{K} a_{k0} x(n)|x(n)|^{k-1} + \\ + \sum_{k=1}^{K} a_{k1} x(n-1)|x(n-1)|^{k-1} + \\ \vdots \\ + \sum_{k=1}^{K} a_{kQ} x(n-Q)|x(n-Q)|^{k-1} \end{cases}$$

2. Here it is noted that the delayed signals x(n−q) do not depend on the summation indices k Thus the partial sums may be factorized into:

Factorize k and q dependence in each sum
$$\begin{cases} = x(n) \underbrace{\sum_{k=1}^{K} a_{k0}|x(n)|^{k-1}}_{T_0(|x(n)|)} + \\ + x(n-1) \underbrace{\sum_{k=1}^{K} a_{k1}|x(n-1)|^{k-1}}_{T_1(|x(n-1)|)} + \\ \vdots \\ + x(n-Q) \underbrace{\sum_{k=1}^{K} a_{kQ}|x(n-Q)|^{k-1}}_{T_Q(|x(n-Q)|)} \end{cases}$$

3. Identify the polynomials $T_q(|x(n-q)|)$ to obtain:

$$PD(n) = \sum_{q=0}^{Q} x(n-q) T_q(|x(n-q)|) \quad (2)$$

Figure 6:
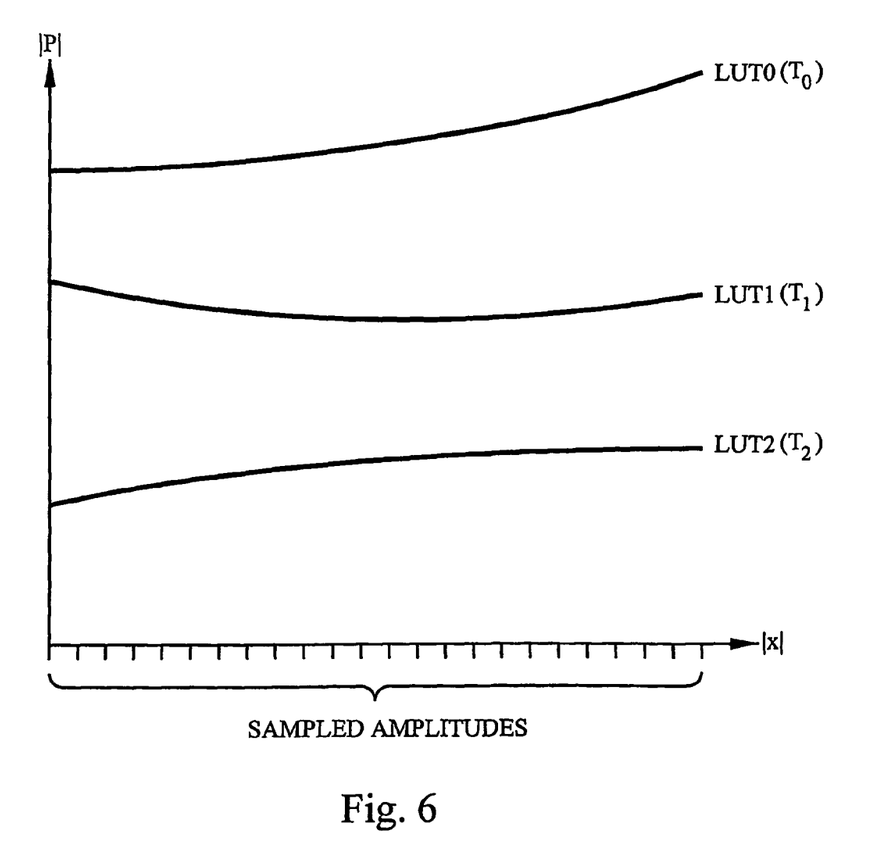
FIG. 6 is a diagram illustrating discretization of polynomials in accordance with the present invention.
Figure 7:
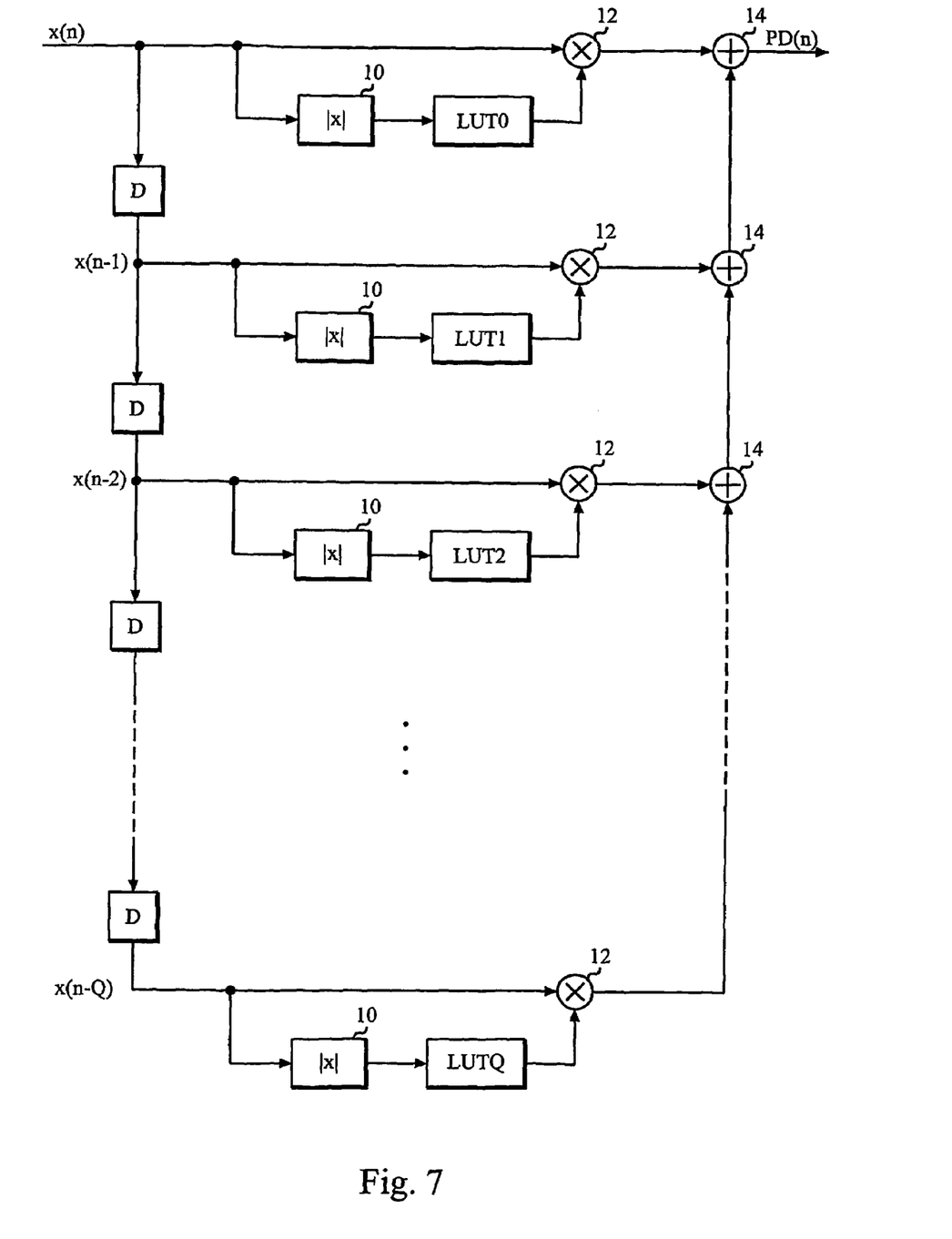
FIG. 7 is a block diagram of an exemplary embodiment of a pre-distorter suitable to be trained in accordance with the present invention.

It is noted in (2) that $T_q(|x(n-q)|)$ are polynomials in the absolute value of the (complex) variable x(n−q). Thus, by multiplying each delayed complex sample x(n−q) by a polynomial in |x(n−q)|(which has the same delay q) and summing up the products for all delays q, the same end result P(n) as in [1] will be obtained. However, this new approach has the advantage that the polynomials $T_q$ may be sampled at appropriate values of |x(n−q)|, as illustrated in FIG. 6, and stored in look-up tables. This will reduce the pre-distorter to a simple FIR filter structure, in which the normally constant filter coefficients are replaced by these look-up tables, as illustrated in FIG. 7. The problem addressed by the present invention is to determine the values of the polynomials $T_q$ at the sampling points in FIG. 6.

In the exemplary embodiment of the present invention illustrated in FIG. 7, the complex input signal x(n) is forwarded to an absolute value block 10 and to a multiplier 12. The absolute value signal from block 10 is forwarded to a look-up table LUT0 representing a sampled version of polynomial $T_0$. The corresponding (generally complex) value from look-up table LUT0 is forwarded to multiplier 12, where it multiplies the input signal sample x(n). Input signal x(n) is also forwarded to a delay block D, where it is delayed one or several sample periods for forming a delayed sample x(n−1). This delayed sample is processed in the same way as the non-delayed sample by an absolute value block 10, a multiplier 12 and a look-up table LUT1. However, look-up table LUT1 now represents a sampled version of polynomial $T_1$ instead of $T_0$. As illustrated in FIG. 7, further delays and look-up tables may be included. Finally, the obtained products are added to each other in adders 14 to form the pre-distorted signal PD(n). Look-up tables used in accordance with the present invention make computation in real time much more efficient than the polynomial computation for each sample of the input signal used in [1]. The look-up tables may be updated (by using the training method described below) to keep track of slow changes in the characteristics of the power amplifier.

Figure 8:
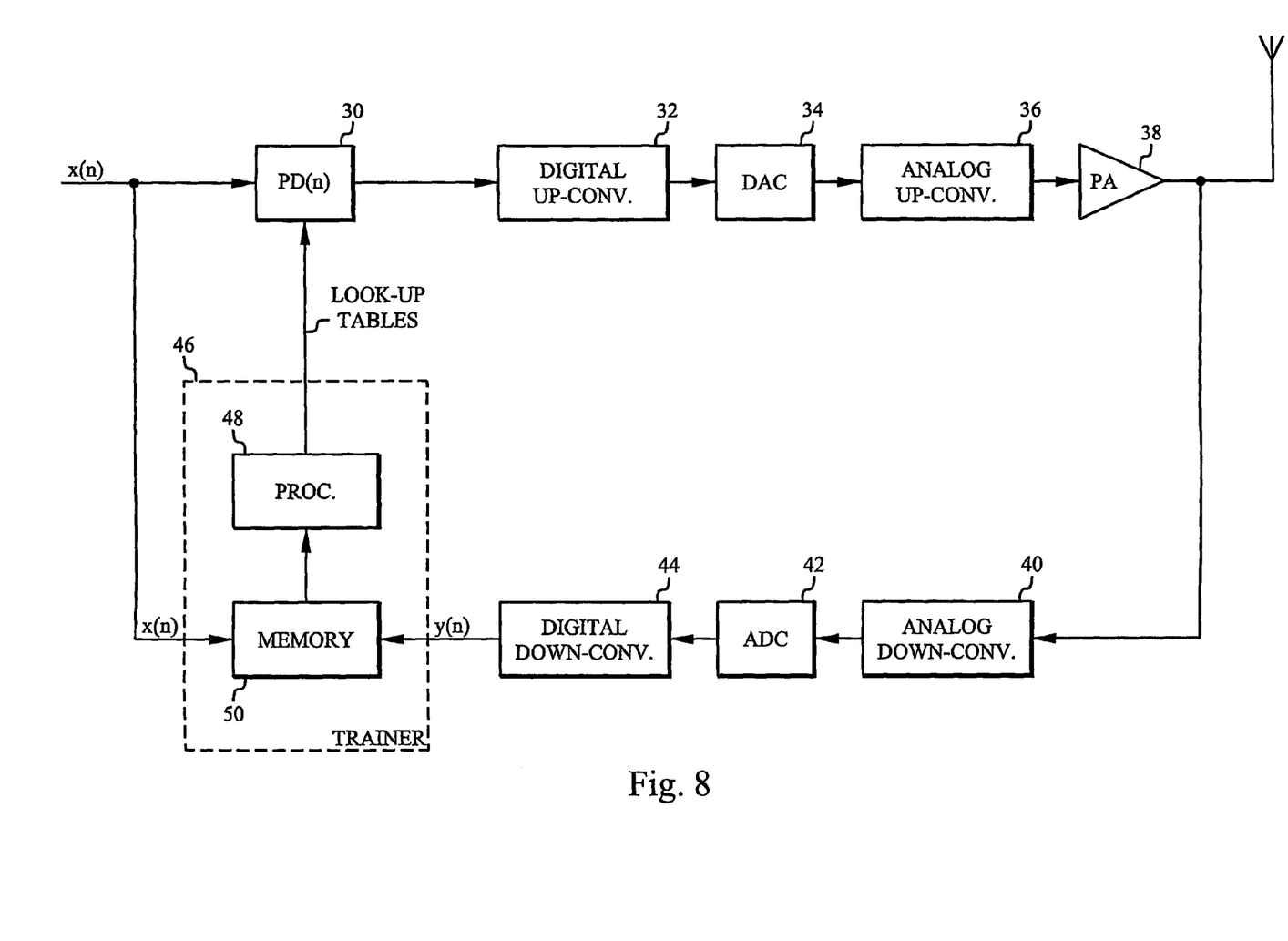
FIG. 8 is a block diagram of an exemplary embodiment of a base station including a power amplifier provided with a pre-distorter in accordance with FIG. 7.

FIG. 8 is a block diagram of an exemplary embodiment of a base station including a power amplifier provided with a pre-distorter in accordance with the present invention. In FIG. 8 elements that are not necessary for understanding the invention have been omitted. The baseband complex signal x(n) is forwarded to a pre-distorter 30 in accordance with the present invention. The pre-distorted signal is up-converted to intermediate frequency (IF) in a digital up-converter 32 and converted into an analog signal in a D/A converter 34, which in turn is up-converted to radio frequency (RF) by an analog up-converter 36. The RF signal is forwarded to a power amplifier 38, and the amplified signal is forwarded to an antenna. The amplified RF signal is also forwarded to a feedback down-conversion chain including an analog down-converter 40, an A/D converter 42 and a digital down-converter 44. The down-converted feedback signal y(n) is forwarded to a trainer 46, which also receives the input signal x(n) for determining the look-up tables in pre-distorter 30 in accordance with the mathematical principles described below.

The training method performed by a processing unit 48 in trainer 46 in FIG. 8 will now be described in more detail. In order to illustrate the training process, a pre-distorter 30 including two look-up tables $T_0$ and $T_1$ (corresponding to LUT0 and LUT1 in FIG. 7, with a one sample delay as an example) will be assumed.

The training procedure is based on measuring a large batch of pre-distorter input and feedback signal pairs $$(x_n, y_n), n=1, \ldots, N$$

where N is the number of signal pairs in the batch (depending on the required accuracy, the number of table entries etc, N is typically between 2000 and 50 000). The measured sample pairs are stored in a memory 50.

The present invention suggests a simple method for determining the lookup tables. This method is based on determining the filter coefficients of each look-up table individually by a corresponding iterative LMS (Least Mean Square) based procedure. An example of such a method is described by the iterative least mean square based procedures for two tables:

$$\begin{cases} T_{0i}(b) = T_{0i-1}(b) + \mu_0 \cdot \dfrac{1}{N_b} \cdot \displaystyle\sum_{|x_k| \in M_b} \dfrac{x_k - y_k}{|x_k|^2} \cdot x_k^* \\ T_{1i}(b) = T_{1i-1}(b) + \mu_1 \cdot \dfrac{1}{N_b} \cdot \displaystyle\sum_{|x_{k-1}| \in M_b} \dfrac{x_k - y_k}{|x_{k-1}|^2} \cdot x_{k-1}^* \end{cases} \quad (3)$$

where
- i is an iteration index,
- b identifies the table bin,
- $\mu_1$ and $\mu_2$ are loop constants associated with each filter tap,
- $N_b$ is the number of stored input signal samples in the batch that have an amplitude that falls within a window $M_b$ around the center amplitude of bin b,
- * denotes complex conjugation.

From equation (3) it is noted that both lookup tables are iteratively solved by equations having the same mathematical form, but by using individual loop constants and different input samples ($x_k$ and $x_{k-1}$, respectively). The real positive loop constants $\mu_1$ and $\mu_2$ may be equal, but are typically different (a larger loop constant for $T_0$ may increase convergence speed). However, the sum of the loop constants should be less than 1 to guarantee stability of the procedure.

The procedure may be repeated until convergence is reached (i.e. until there are only insignificant changes to the approximations from one iteration to the next). Depending on he required accuracy, convergence is usually obtained after 10-20 iterations. However, if the accuracy requirements are relaxed, acceptable tables may be obtained after fewer iterations.

Thus, by solving equation (3) iteratively as described above, the training problem has been reduced to repeatedly solving two equations having the form (3), which are only single table problems of lower complexity.

Equation (3) is valid both for a first time training and for updating the look-up tables. If it is assumed that the tables have not been determined yet, $T_0$ may, for example, initially be set to 1 and $T_1$ may initially be set to 0. However, if the tables are updated, the current tables $T_0, T_1$ may be used as an initial guess instead, since they are probably closer to the optimal tables.

Figure 9:
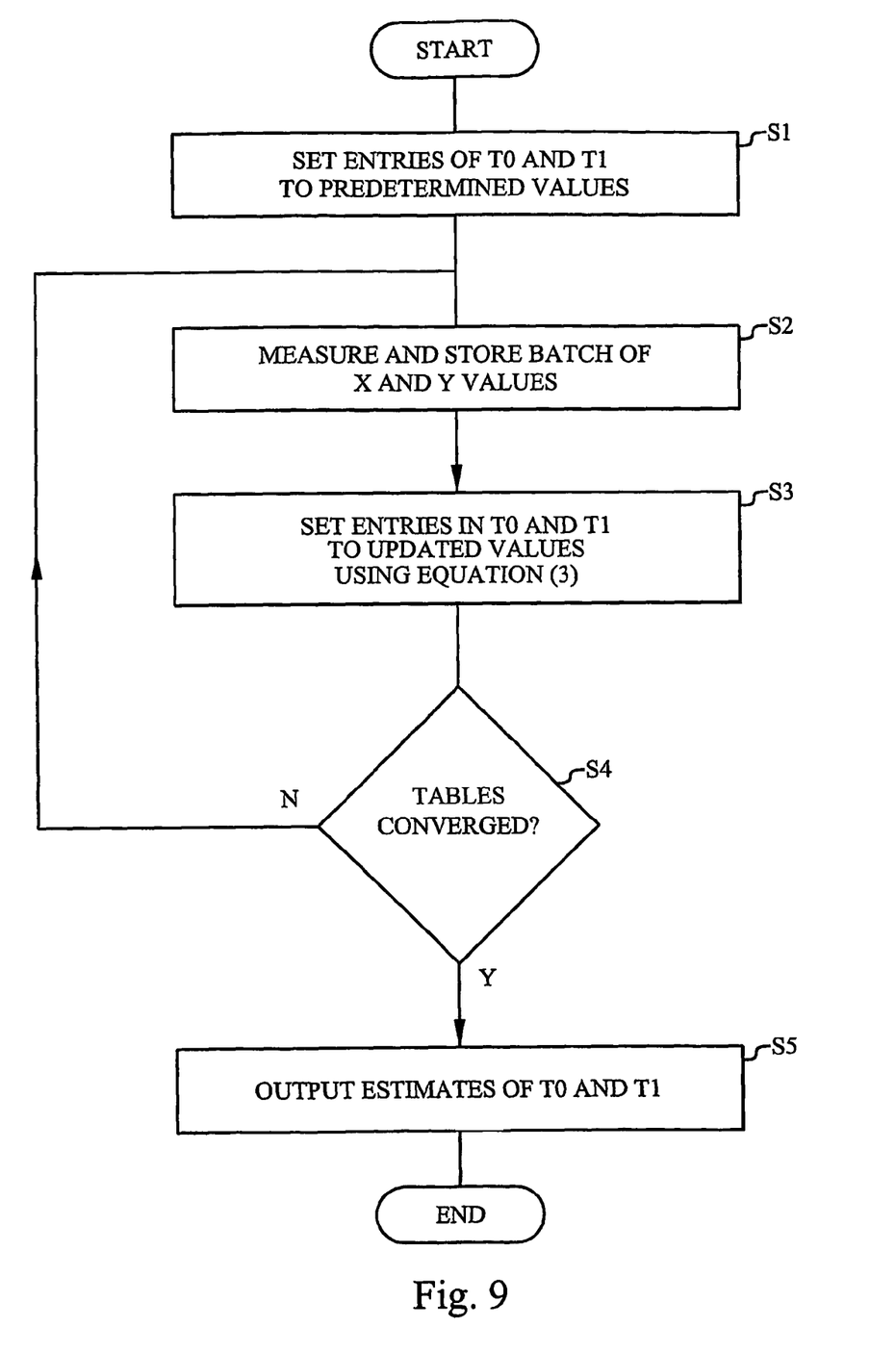
FIG. 9 is a flow chart illustrating an exemplary embodiment of the training method in accordance with the present invention.

FIG. 9 is a flow chart illustrating an exemplary embodiment of the training method in accordance with the present invention for a two-table pre-distorter. Step S1 sets the elements of tables $T_0$ and $T_1$ to predetermined values. Step S2 measures and stores a batch of x and y values. Step S3 determines new estimates of $T_0$ and $T_1$ using equation (3). Step S4 tests whether the tables have converged. This can be done, for example, by summing the absolute values (or squares) of the differences between corresponding entries of the current estimates and the previous estimates and testing whether the obtained sum is smaller than a predetermined threshold. If the tables have converged, the current estimates are provided as the final tables in step S5. If the tables have not converged, steps S2-S4 are repeated.

The outlined iterative method of successively improving table accuracy may be extended to include more tables. Further tables, which take into account memory effects of other time delays, may be included in the same manner as in the two-table solution. In this case the procedures may be written as:

$$\begin{cases} T_{0i}(b) = T_{0i-1}(b) + \mu_0 \cdot \dfrac{1}{N_b} \cdot \displaystyle\sum_{|x_k| \in M_b} \dfrac{x_k - y_k}{|x_k|^2} \cdot x_k^* \\ T_{1i}(b) = T_{1i-1}(b) + \mu_1 \cdot \dfrac{1}{N_b} \cdot \displaystyle\sum_{|x_{k-1}| \in M_b} \dfrac{x_k - y_{k-1}}{|x_{k-1}|^2} \cdot x_{k-1}^* \\ \vdots \\ T_{Qi}(b) = T_{Qi-1}(b) + \mu_n \cdot \dfrac{1}{N_b} \cdot \displaystyle\sum_{|x_{k-Q}| \in M_b} \dfrac{x_k - y_k}{|x_{k-Q}|^2} \cdot x_{k-Q}^* \end{cases} \quad (4)$$

Thus, for a general delay q one has:

$$T_{qi}(b) = T_{qi-1}(b) + \mu_q \cdot \dfrac{1}{N_b} \cdot \sum_{|x_{k-q}| \in M_b} \dfrac{x_k - y_k}{|x_{k-q}|^2} \cdot x_{k-q}^* \quad (5)$$

As noted above, the delays q associated with the tables need not be consecutive integers, but may differ by more than 1 sample period.

Equation (5) may be simplified by replacing the values $|X^{k-q}|^2$ in the elements of the sum with the average power of the samples in bin b, thereby avoiding the divisions. This gives the equation:

$$T_{qi}(b) = T_{qi-1}(b) + \mu_q \cdot u(b) \dfrac{1}{N_b} \cdot \sum_{|x_{k-q}| \in M_b} (x_k - y_k) \cdot x_{k-q}^* \quad (6)$$

where $$u(b) = \dfrac{1}{|\overline{x_b}|^2} \quad (7)$$

Here $|\overline{x_b}|$ denotes the center amplitude of bin b.

Figure 10:
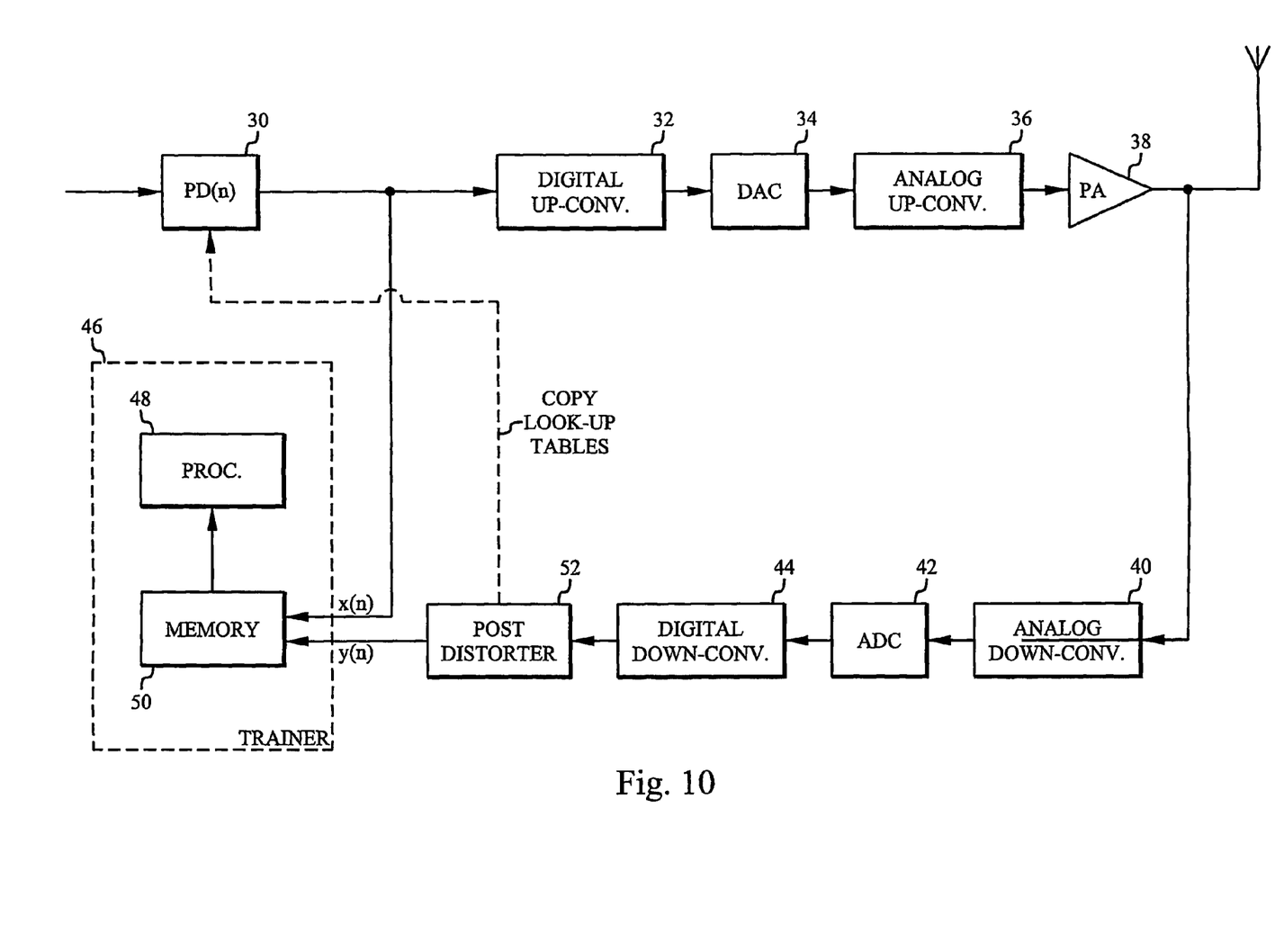
FIG. 10 is a block diagram of another exemplary embodiment of a base station including a power amplifier provided with a pre-distorter in accordance with FIG. 7.

A variation of the above described method is obtained by inserting a post-distorter, which has the same table structure as pre-distorter 30, in the feedback loop. Such an embodiment is illustrated in FIG. 10 where a post-distorter 52 has been inserted between elements 44 and 50. During training pre-distorter 30 is left unchanged and post-distorter 52 is determined instead. When it has been determined the tables in post-distorter 50 have converged, the tables are copied over to pre-distorter 30. The post-distorter will in this embodiment undo the distortion of the amplifier during training, since the pre-distorted samples are now amplified (and distorted) and then post-distorted back to the pre-distorted samples, which undoes the distortion of the amplifier. The same equations may still be used if x denotes the unamplified but pre-distorted samples and y denotes the post-distorted feedback samples.

Figure 11:
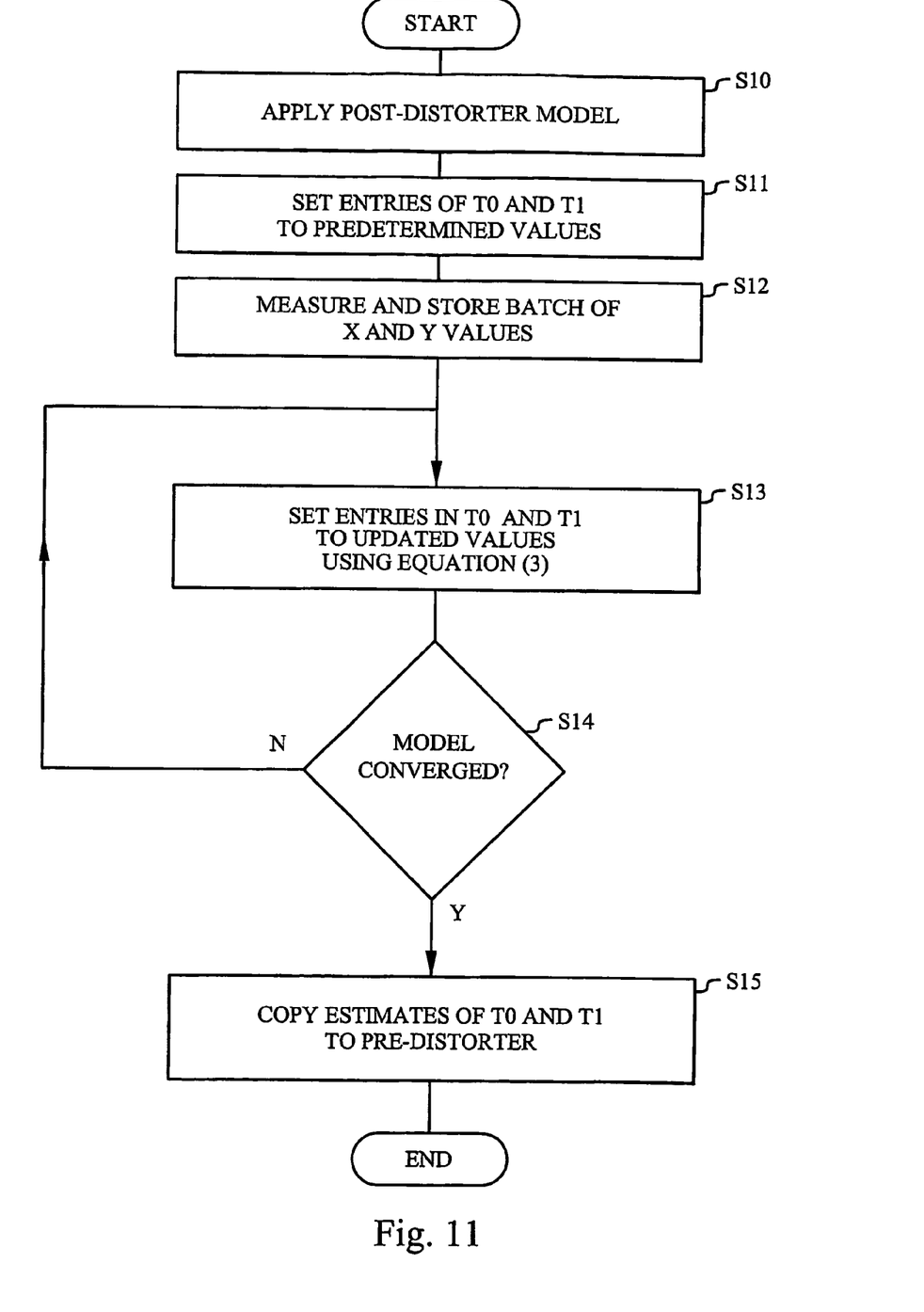
FIG. 11 is a flow chart illustrating another exemplary embodiment of the training method in accordance with the present invention.

FIG. 11 is a flow chart illustrating an exemplary embodiment of the training method in accordance with the just described variation of present invention for two tables. Step S10 applies the post-distorter model. Step S11 sets the elements of tables $T_0$ and $T_1$ to predetermined values. Step S12 measures and stores a batch of x and y values. Step S13 determines new estimates of $T_0$ and $T_1$ using equation (3). Step S14 tests whether the post-distorter model has converged. This can be done, for example, by summing the absolute values (or squares) of the differences between corresponding entries of the current table estimates and the previous estimates and testing whether the obtained sum is smaller than a predetermined threshold. If the model has converged, the current table estimates are copied over to the pre-distorter in step S15. If not, steps S13-S14 are repeated.

In the embodiments described so far an average correction based on a lot of samples was used to form the iterative equations. This requires storage of a large number of samples and updates all table entries. An alternative method is to update after every sample. In this case only the table entries that correspond to the bin b into which the current input sample happens to fall is updated. For this embodiment equation (5) reduces to:

$$T_{qi}(b) = T_{qi-1}(b) + \mu_q \cdot (x_k - y_k) \cdot \frac{x^*_{k-q}}{|x_{k-q}|^2}: |x_{k-q}| \in M_b \quad (8)$$

while equation (6) reduces to:

$$T_{qi}(b) = T_{qi-1}(b) + \mu_q \cdot u(b) \cdot (x_k - y_k) \cdot x^*_{k-q} : |x_{k-q}| \in M_b \quad (9)$$

An advantage of this embodiment is that only the latest Q (the maximum delay) sample pairs have to be stored in the batch, which requires less memory. This approach typically requires only one iteration for every new sample, since the current table entries in a stationary state should be very close to the optimal values.

In the above description the training procedure has been expressed in Cartesian form using a complex number representation. An alternative is to perform a transformation to polar form and express the procedure in two-component form, with one procedure representing the iterations in the radial component and one procedure representing the iterations in the phase component. Furthermore, in the given examples the delay q has been assumed to be positive or zero. However, negative values for q are also possible. For example, the zero delay table may be the middle table in the filter structure.

The described look-up table based pre-distorter may be implemented as an FPGA (Field Programmable Gate Array) or an ASIC (Application Specific Integrated Circuit). Another possibility is to use a micro processor or a micro/signal processor combination and corresponding software. Combinations of these approaches are also possible. The actual computation of the look-up table entries may be done either in real-time on a sample by sample basis or in an off-line manner at a slow update speed, as described above.

An especially attractive feature of the present invention is that the complexity growth when tables are added only is linear instead of quadratic. This reduced complexity may be used to increase the table update rate, thereby obtaining a more accurate pre-distorter. In fact, by using the procedure in accordance with equation (8) or (9) one entry of each table is updated every sample period.

Although the present invention has been described with reference to individual LMS based iterative procedures for each table, it is also feasible to use other iterative procedures, such as RLS (Recursive Least Square) or Kalman based procedures. Although such methods are inherently more complex, they have the advantage of a faster convergence rate.

It will be understood by those skilled in the art that various modifications and changes may be made to the present invention without departure from the scope thereof, which is defined by the appended claims.

REFERENCES

[1] Lei Ding, G. Tong Zhou, Zhengxiang Ma, Dennis R. Morgan, J. Stevenson Kenney, Jaehyeong Kim, Charles R. Giardina, (School of electrical and computer engineering, Georgia Institute of Technology, Atlanta), "A robust digital baseband predistorter constructed using memory polynomials", Manuscript submitted to IEEE Trans. on Communication, Mar. 16, 2002.

[2] J. Kim and K. Konstantinou, "Digital predistortion of wideband signals based on power amplifier model with memory", IEE Electronics Letters, 8 Nov. 2001, Vol. 37 No. 23.

[3] EP 1 088 390 B1, PMC-Sierra Inc.

The invention claimed is:

1. A training method for a power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, said training method comprising the steps of:

storing measured unamplified input signal samples and corresponding power amplifier output signal feedback samples;

determining look-up table filter coefficients for each filter tap by separate independent iterative procedures using said stored samples, wherein said iterative procedures are least mean square based, said step of determining comprising:

calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$T_{qi}(b) = T_{qi-1}(b) + \mu_q \cdot \frac{1}{N_b} \cdot \sum_{|x_{k-q}| \in M_b} \frac{x_k - y_k}{|x_{k-q}|^2} \cdot x^*_{k-q}$$

where:
$\mu_q$ is a predetermined constant associated with filter tap q;
$N_b$ is the number of stored input signal samples that have an amplitude that falls within a predetermined window $M_b$ around the center amplitude of bin b;
$x_{k-q}$ is a stored input signal sample that has a delay q;
$y_k$ is a power amplifier output signal feedback sample corresponding to power amplifier input signal sample $x_k$; and,
* denotes complex conjugation.

2. A training method for a power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, said training method comprising the steps of:

storing measured unamplified input signal samples and corresponding power amplifier output signal feedback samples;

determining look-up table filter coefficients for each filter tap by separate independent iterative procedures using said stored samples, wherein said iterative procedures are least mean square based, said step of determining comprising:

calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$\begin{cases} T_{qi}(b) = T_{qi-1}(b) + \mu_q \cdot u(b) \frac{1}{N_b} \cdot \sum_{|x_{k-q}| \in M_b} (x_k - y_k) \cdot x_{k-q}^* \\ u(b) = \frac{1}{|\overline{x_b}|^2} \end{cases}$$

where:

$\mu_q$ is a constant associated with filter tap q;

$N_b$ is the number of stored input signal samples that have an amplitude that falls within a predetermined window $M_b$ around the center amplitude $|\overline{x_b}|$ of bin b;

$x_{k-q}$ is a stored input signal sample that has a delay q;

$y_k$ is a power amplifier output signal feedback sample corresponding to input signal sample $x_k$; and,

* denotes complex conjugation.

3. A training method for a power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, said training method comprising the steps of:

storing measured unamplified input signal samples and corresponding power amplifier output signal feedback samples;

determining look-up table filter coefficients for each filter tap by separate independent iterative procedures using said stored samples, wherein said iterative procedures are least mean square based, said step of determining comprising:

calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$T_{qi}(b) = T_{qi-1}(b) + \mu_q \cdot (x_k - y_k) \cdot \frac{x_{k-q}^*}{|x_{k-q}|^2} : |x_{k-q}| \in M_b$$

where:

$\mu_q$ is a constant associated with filter tap q;

$x_{k-q}$ is a stored input signal sample that has that has a delay q and an amplitude that falls within a predetermined window $M_b$ around the center amplitude of bin b;

$y_k$ is a power amplifier output signal feedback sample corresponding to input signal sample $x_k$; and,

* denotes complex conjugation.

4. A training method for a power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap said training method comprising the steps of:

storing measured unamplified input signal samples and corresponding power amplifier output signal feedback samples;

determining look-up table filter coefficients for each filter tap by separate independent iterative procedures using said stored samples, wherein said iterative procedures are least mean square based, said step of determining comprising:

calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$\begin{cases} T_{qi}(b) = T_{qi-1}(b) + \mu_q \cdot u(b) \cdot (x_k - y_k) \cdot x_{k-q}^* : |x_{k-q}| \in M_b \\ u(b) = \frac{1}{|\overline{x_b}|^2} \end{cases}$$

where:

$\mu_q$ is a constant associated with filter tap q;

$x_{k-q}$ is a stored input signal sample that has a delay q and an amplitude that falls within a predetermined window $M_b$ around the center amplitude $|\overline{x_b}|$ of bin b; $x_k$ is a power amplifier input signal sample that $y_{k-q}$ is a power amplifier output signal feedback sample corresponding to input signal sample $x_k$; and,

* denotes complex conjugation.

5. A power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, wherein the pre-distorter comprises:

means for storing measured unamplified input signal samples and corresponding power amplifier output signal feedback samples;

means for determining look-up table filter coefficients for each filter tap by separate independent iterative procedures using said stored samples, wherein said iterative procedures are least mean square based, said means for determining comprising:

means for calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$T_{qi}(b) = T_{qi-1}(b) + \mu_q \cdot \frac{1}{N_b} \cdot \sum_{|x_{k-q}| \in M_b} \frac{x_k - y_k}{|x_{k-q}|^2} \cdot x_{k-q}^*$$

where:
- $\mu_q$ is a predetermined constant associated with filter tap q;
- $N_b$ is the number of stored input signal samples that have an amplitude that falls within a predetermined window $M_b$ around the center amplitude of bin b;
- $x_{k-q}$ is a stored input signal sample that has a delay q;
- $y_k$ is a power amplifier output signal feedback sample corresponding to input signal sample $x_k$; and,
- * denotes complex conjugation.

6. A power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, wherein the pre-distorter comprises:

means for storing measured unamplified input signal samples and corresponding power amplifier output signal feedback samples;

means for determining look-up table filter coefficients for each filter tap by separate independent iterative procedures using said stored samples, wherein said iterative procedures are least mean square based, said means for determining comprising:

means for calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$\begin{cases} T_{qi}(b) = T_{qi-1}(b) + \mu_q \cdot u(b) \frac{1}{N_b} \cdot \sum_{|x_{k-q}| \in M_b} (x_k - y_k) \cdot x_{k-q}^* \\ u(b) = \frac{1}{|\overline{x_b}|^2} \end{cases}$$

where:
- $\mu_q$ is a constant associated with filter tap q,
- $N_b$ is the number of stored input signal samples that have an amplitude that falls within a predetermined window $M_b$ around the center amplitude $|\overline{x_b}|$ of bin b;
- $x_{k-q}$ is a stored input signal sample that has a delay q;
- $y_k$ is a power amplifier output signal feedback sample corresponding to input signal sample $x_k$; and,
- * denotes complex conjugation.

7. A power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, wherein the pre-distorter comprises:

means for storing measured unamplified input signal samples and corresponding power amplifier output signal feedback samples;

means for determining look-up table filter coefficients for each filter tap by separate independent iterative procedures using said stored samples, wherein said iterative procedures are least mean square based, said means for determining comprising:

means for calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$T_{qi}(b) = T_{qi-1}(b) + \mu_q \cdot (x_k - y_k) \cdot \frac{x_{k-q}^*}{|x_{k-q}|^2} : |x_{k-q}| \in M_b$$

where:
- $\mu_q$ is a constant associated with filter tap q;
- $x_{k-q}$ is a stored input signal sample that has that has a delay q and an amplitude that falls within a predetermined window $M_b$ around the center amplitude of bin b;
- $y_k$ is a power amplifier output signal feedback sample corresponding to input signal sample $x_k$; and,
- * denotes complex conjugation.

8. A power amplifier pre-distorter formed by a Finite Impulse Response (FIR) filter structure comprising an individual look-up table for each filter tap, each look-up table representing a discretized polynomial in a variable representing input signal amplitude, and means for selecting, from each filter tap look-up table, a filter coefficient that depends on the amplitude of a corresponding complex signal value to be multiplied by the filter tap, wherein the pre-distorter comprises:

means for storing measured unamplified input signal samples and corresponding power amplifier output signal feedback samples;

means for determining look-up table filter coefficients for each filter tap by separate independent iterative procedures using said stored samples, wherein said iterative procedures are least mean square based, said means for determining comprising:

means for calculating a refined filter coefficient estimate $T_{qi}(b)$ corresponding to a filter tap with a delay q and a signal amplitude bin b from a previous filter coefficient estimate $T_{qi-1}(b)$ in accordance with the equation:

$$\begin{cases} T_{qi}(b) = T_{qi-1}(b) + \mu_q \cdot u(b) \cdot (x_k - y_k) \cdot x_{k-q}^* : |x_{k-q}| \in M_b \\ u(b) = \frac{1}{|\overline{x_b}|^2} \end{cases}$$

where:
- $\mu_q$ is a constant associated with filter tap q;
- $x_{k-q}$ is a stored input signal sample that has that has a delay q and an amplitude that falls within a predetermined window $M_b$ around the center amplitude $|\overline{x_b}|$ of bin b;
- $x_k$ is a power amplifier input signal sample that $y_{k-q}$ is a power amplifier output signal feedback sample corresponding to input signal sample $x_k$; and,
- * denotes complex conjugation.

* * * * *